United States Patent
Noda et al.

(10) Patent No.: US 11,482,414 B2
(45) Date of Patent: Oct. 25, 2022

(54) ULTRA-LOW TEMPERATURE ALD TO FORM HIGH-QUALITY SI-CONTAINING FILM

(71) Applicant: L'Air Liquide, Société Anonyme pour l'Etude et l'Exploitation des Procédés Georges Claude, Paris (FR)

(72) Inventors: Naoto Noda, Tsukuba (JP); Ivan Oshchepkov, Tsukuba (JP); Jean-Marc Girard, Versailles (FR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 16/718,369

(22) Filed: Dec. 18, 2019

(65) Prior Publication Data

US 2020/0373148 A1   Nov. 26, 2020

(51) Int. Cl.
*H01L 21/02* (2006.01)
*C23C 16/34* (2006.01)
*C23C 16/455* (2006.01)
*C23C 16/30* (2006.01)

(52) U.S. Cl.
CPC ........ *H01L 21/0228* (2013.01); *C23C 16/308* (2013.01); *C23C 16/345* (2013.01); *C23C 16/45536* (2013.01); *H01L 21/0214* (2013.01); *H01L 21/0217* (2013.01); *H01L 21/02208* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 8,357,430 B2 | 1/2013 | Dussarrat et al. | |
| 9,184,159 B2 | 11/2015 | Niroomand et al. | |
| 2009/0075490 A1 | 3/2009 | Dussarrat | |
| 2009/0232985 A1 | 9/2009 | Dussarrat et al. | |
| 2013/0189854 A1 | 7/2013 | Hausmann et al. | |
| 2015/0014823 A1 | 1/2015 | Mallikarjunan et al. | |
| 2015/0021599 A1 | 1/2015 | Ridgeway et al. | |
| 2015/0099342 A1 | 4/2015 | Tsai et al. | |
| 2016/0293398 A1 | 10/2016 | Danek et al. | |
| 2017/0338109 A1 | 11/2017 | Lei et al. | |
| 2018/0245215 A1 | 8/2018 | Lei et al. | |
| 2020/0361966 A1* | 11/2020 | Kim ................. | C23C 16/345 |
| 2020/0381623 A1* | 12/2020 | Qi ................... | H01L 45/16 |

FOREIGN PATENT DOCUMENTS

JP   2014 060309   4/2014

OTHER PUBLICATIONS

Meng et al., "Atomic Layer Deposition of Silicon Nitride Thin Films: A Review of Recent Progress, Challenges, and Outlooks", Materials 2016, 9, 1007. (Year: 2016).*

(Continued)

*Primary Examiner* — Asok K Sarkar
(74) *Attorney, Agent, or Firm* — Yan Jiang

(57) ABSTRACT

Disclosed is a method for forming Si-containing films, such as SiN film, by PEALD using trisilylamine (TSA) at ultralow temperature, such as a temperature below 250° C.

15 Claims, 1 Drawing Sheet

(56) References Cited

OTHER PUBLICATIONS

Lucero et al., "Silicon Nitride Atomic Layer Deposition: A Brief Review of Precursor Chemistry", Material Matters, 2018, 13.2 (Year: 2018).*

Kaloyeros et al.,"Review—Silicon Nitride and Silicon Nitride-Rich Thin Film Technologies: State-of-the-Art Processing Technologies, Properties, and Applications", ECS Journal of Solid State Science and Technology, 2020, 9, 063006. (Year: 2020).*

Knoops, H.C.M. et al., Atomic layer deposition of silicon nitride from bis(tert-butylamino)silane and $N_2$ plasma, Appl. Mater. Interfaces, 2015, 7, 35, 19857-19862.

Tamaoki, N. et al., Low temperature solution for silicon nitride LPCVD using Cl-free inorganic trisilylamine, Proceedings of Chemical Vapor Deposition XVI and EUROCVD 14, 2003, 1372.

International Search Report and Written Opinion for corresponding PCT/US2020/066050, dated Apr. 13, 2021.

* cited by examiner

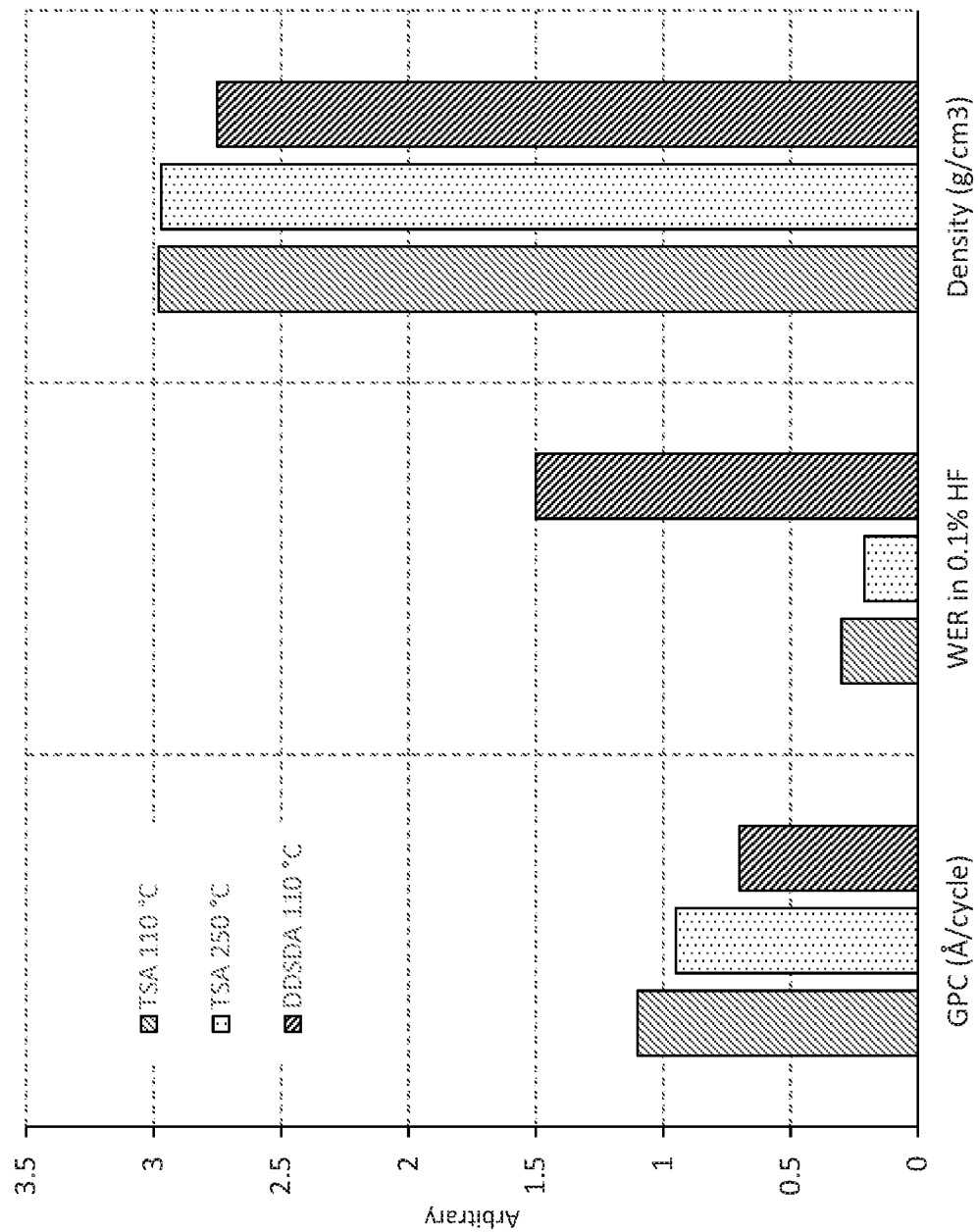

ULTRA-LOW TEMPERATURE ALD TO FORM HIGH-QUALITY SI-CONTAINING FILM

TECHNICAL FIELD

This invention is related to methods for forming a Si-containing film, such as SiN film, through plasma enhanced atomic layer deposition (PEALD) using trisilylamine (TSA) at ultra-low temperature, such as a temperature below 250° C.

BACKGROUND

Silicon-containing films, such as silicon nitride (SiN) films, silicon oxide ($SiO_2$) films and silicon oxynitride (SiON) films, are widely used in semiconductor or photovoltaic (PV) technology. The SiN film is used as a protection layer, barrier layer, charge trap layer, or patterning masking layer in semiconductor manufacturing. Especially multiple patterning is one of recent key manufacturing technologies to enhance a feature density of integrated circuits.

Atomic layer deposition (ALD) is used to form Si-containing films as patterning layers or protection layers, to achieve conformal deposition on newer semiconductor devices that have complicated and fine structures with high aspect ratio (AR), such as 3D structures. For example, in a self-aligned double pattern (SADP) process; a dielectric film should be conformally deposited over dummy patterns or mandrels. Here the mandrels are often made of organic materials like photo resist (PR) or amorphous-carbon (a-C), therefore the deposited dielectric film has to be compatible with heat resistance of the patterns and/or mandrels.

In most cases (e.g. U.S. Pat. No. 9,184,159B2) the ALD deposited Si-containing film is a $SiO_2$ film. SiN would be desirable because it has a great etching resistance and thus provides a good hard mask property during the next SADP and for self-aligned quadruple patterning (SAQP) sequences steps.

Trisilylamine (TSA), $N(SiH_3)_3$, has been used as a precursor to form SiN film. For example, US20150099342 to Tsai et al. discloses a method to form $SiO_2$ film by using TSA on a thermally resistive substrate is described. The deposition temperature is in a range of 400° C. to 1000° C., which may be not compatible with deposition on organic films. US20170338109 to Lei et al. discloses a method for forming Si-containing film by using TSA is also described. Based on FIG. 1 in the patent document, conformal film was obtained in a temperature range of 250° C. to 400° C., which may also be not compatible with deposition on organic films. U.S. Pat. No. 8,357,430 to Dussarrat et al. discloses a method to form SiN film by chemical vapor deposition (CVD) using TSA, in a temperature range of 300° C. to 900° C., is described, which may also be not compatible with deposition on organic films. US20090075490 to Dussarrat discloses a method of forming a silicon-containing film at a temperature equal or less than 550° C. by atomic layer deposition (ALD). US20090232985 to Dussarrat et al., discloses a method of forming silicon oxide containing films at a substrate temperature of 50° C. to 4000° C. by vapor deposition processes under reduced pressure. Sato et al., (Proceedings of Chemical Vapor Deposition XVI and EUROCVD 14, page 1372, 2003) disclose low temperature solution for silicon nitride LPCVD using Cl-free inorganic trisilylamine.

In recent years, SiN film deposition on a substrate containing organic materials such as photo resist layer and on non-thermally resistive functional layer such as GeSbTe (GST) has been required.

However, deposition temperatures in US20150099342 or US20170338109 are too high to avoid damaging the substrate. Especially when a thermal stability of the substrate that contains organic materials or chalcogenide is low, it is difficult to form the patterning layer and the protective film on the substrate at such a high temperature.

Lowering deposition temperature is acceptable to form a film on a non-thermally resistive film. However, it may result in a lower density or an increase of impurity due to a lower reactivity of a precursor and a reactant. Thus film quality limits the temperature of most depositions, such as described above, to temperatures that damage organic or chalcogenide substrates.

For these reasons, there is a need for low temperature deposition processes to form low impurity and high density Si-containing films on substrates having organic materials and/or chalcogenides.

SUMMARY

There is disclosed a method for depositing a silicon-containing film on at least a part of the surface of a substrate comprising the steps of a) introducing a vapor of trisilylamine into a reactor having a substrate disposed therein; b) introducing a co-reactant gas into the reactor; and c) repeating the steps of a) and b) until a desired thickness of the silicon-containing film is deposited on the substrate using a vapor deposition method at a deposition temperature ranging from approximately 20° C. to approximately 250° C.

The disclosed method may include one or more of the following aspects:

further comprising the steps of:
  purging the reactor with a first purging gas following the step of a); and
  purging the reactor with a second purging gas following the step of b);
the first purging gas and the second purging gas being an inert gas selected from $N_2$, Ar, Kr or Xe;
The vapor deposition method being an ALD;
The vapor deposition method being a PEALD;
The vapor deposition method being a spatial ALD;
The vapor deposition method being a spatial PEALD;
the deposition temperature being below approximately 250° C.;
the deposition temperature being below approximately 150° C.;
the deposition temperature being below approximately 110° C.;
the deposition temperature ranging from approximately room temperature to approximately 250° C.;
the deposition temperature ranging from approximately 20° C. to approximately 150° C.;
the deposition temperature ranging from approximately 20° C. to approximately 110° C.;
the deposition temperature ranging from approximately 20° C. to approximately 50° C.;
the substrates having a temperature below approximately 250° C.;
the substrates having a temperature below approximately 150° C.;
the substrates having a temperature below approximately 110° C.;

the substrates having a temperature range from approximately room temperature to approximately 250° C.;
the substrates having a temperature range from approximately 20° C. to approximately 150° C.;
the substrates having a temperature range from approximately 20° C. to approximately 110° C.;
the substrates having a temperature range from approximately 20° C. to approximately 50° C.;
the reactor wall being heated to approximately 300° C. or lower;
the reactor wall being heated to a temperature range from approximately 20° C. to approximately 250° C.;
the reactor wall being heated to a temperature range from approximately 20° C. to approximately 150° C.;
the reactor wall being heated to a temperature range from approximately 20° C. to approximately 50° C.;
the pressure in the reactor being held between approximately 0.1 Torr and approximately 100 Torr;
the pressure in the reactor being held between approximately 1 Torr and approximately 50 Torr;
the pressure in the reactor being held between approximately 1 Torr and approximately 10 Torr;
the co-reactant being a plasma source containing at least one of hydrogen, nitrogen, and oxygen;
the plasma source being selected from the group consisting of nitrogen plasma, nitrogen/helium plasma, nitrogen/argon plasma, ammonia plasma, ammonia/helium plasma, ammonia/argon plasma, helium plasma, argon plasma, hydrogen plasma, hydrogen/helium plasma, hydrogen/organic amine plasma, and mixtures thereof;
the substrate having an aperture having an aspect ratio of around 1:1 to around 40:1;
the aperture being a trench;
the aperture being a hole or via;
the silicon-containing film covers at least a part the aperture;
a step coverage of the side wall of the aperture is in a range of around 0.6 to around 1.2, and a step coverage of the bottom of the aperture is in a range of around 0.6 to around 1.5;
the substrate being a heat sensitive substrate;
the heat sensitive substrate containing organic materials selected from photo resist, a-C, plastics, polyimides, or chalcogenide;
the substrate containing heat sensitive features;
the heat sensitive features including extremely fine metal lines in the substrate;
the heat sensitive features including semiconductor fins in the substrate;
a reactant or a co-reactant being introduced into the reactor;
the co-reactant being a reducing gas or a nitrogen-containing gas;
the nitrogen-containing gas including, but is not limited to, $NH_3$, NO, $N_2O$, hydrazines, primary amines such as methylamine, ethylamine, tertbutylamine;
secondary amines such as dimethylamine, diethylamine, di-isopropylamine, ethylmethylamine, pyrrolidine; tertiary amines such as trimethylamine, triethylamine, trisilylamine, $N_2$, $N_2/H_2$ mixture thereof;
the nitrogen-containing gas being $NH_3$;
the co-reactant being activated by a plasma, either in-situ or remotely; for $N_2$ or $N_2/H_2$, the plasma activation being required;
the co-reactant being selected from $NH_3$, NO, $N_2O$, hydrazines, $N_2$ plasma, $N_2/H_2$ plasma; amines and combinations thereof;
the co-reactant being $N_2$ plasma;
$N_2$ plasma being an adequate co-reactant when the substrate temperature is lower than 250° C.;
the co-reactant being an oxidizer or an oxygen-containing gas;
the oxygen-containing gas including, but is not limited to, oxidizers such as, $O_3$, $O_2$, $H_2O$, NO, $N_2O$, $H_2O_2$, O radicals and combinations thereof;
the oxygen-containing gas being $O_3$ or $O_2$;
the Si containing film containing SiN, $SiO_2$ or SiON;
the Si containing film containing SiN or SiON;
the Si containing film containing SiN;
a Growth per cycle (GPC) of the Si containing film being in the range of around 0.015 nm/cycle to around 0.15 nm/cycle;
a RI (refractive index) of the silicon-containing film being around 1.96;
the silicon-containing film being carbon free;
C concentration in the silicon-containing film being in the range of 0% to approximately 3%; and
a density of the silicon-containing film being around 2.98 $g/cm^3$.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g.; $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or from nitride-based films (for example, TaN, TiN, NbN) that are used as electrodes, One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of films on a substrate and at least the top-most film having topographic features that have been created in steps prior to the deposition of the silicon-containing film.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "precursor" and "deposition compound" and "deposition gas" may be used interchangeably when the precursor is in a gaseous state at room temperature and ambient pressure. It is understood that a precursor may correspond to, or related to a deposition compound or deposition gas, and that the deposition compound or deposition gas may refer to the precursor.

Note that herein, the terms "deposition temperature" and "substrate temperature" may be used interchangeably. It is understood that a substrate temperature may correspond to, or related to a deposition temperature, and that the deposition temperature may refer to the substrate temperature.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements might be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN, SiO and SiON, are listed throughout the specification and claims without reference to their proper stoichiometry. The silicon-containing films may also include dopants, such as B, P, As, Ga and/or Ge. The fact that the film contains some residual hydrogen is also omitted from the film composition description. For instance, an SiOC film may contain residual H.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to one "embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x (NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 1 is a graph demonstrating the results of GPC, WER and density of PEALD of SiN film with TSA at 110° C. and 250° C.

DESCRIPTION OF PREFERRED EMBODIMENTS

Disclosed are methods for forming a Si-containing film by plasma enhanced ALD (PEALD) using trisilylamine (TSA) at ultralow temperature, such as below 250° C. More specifically, the disclosed are the methods for forming SiN, $SiO_2$ or SiON film by PEALD using TSA at a temperature below 250° C.

Recently, in semiconductor manufacturing processes, it has been required to deposit silicon-containing films on a heat sensitive substrate. The heat sensitive substrate may contain organic materials, such as, photo resist (PR), amorphous-carbon (a-C), plastics, polyimides, or chalcogenides (e.g., GeSbTe (GST)). The heat sensitive substrate may contain heat sensitive features, such as, extremely fine metal lines and/or semiconductor fins in the substrate. In order to deposit the silicon-containing film on the heat sensitive substrate and protect the heat sensitive substrate materials, a high-quality silicon-containing film having a low etch rate, high density, excellent step coverage (SC), low Si—H content, free carbon and halogen contaminations, high growth rate, and deposition temperature below 250° C. is needed. The disclosed methods describe applying a precursor TSA to a PEALD process to produce such high-quality silicon-containing films with $N_2$ plasma at a temperature below 250° C., preferably at a temperature below 150° C., more preferably at a temperature below 110° C. The Si-containing films formed by the disclosed methods include, but are not limited to, a SiN film, a $SiO_2$ film or a SiON film.

The disclosed precursor TSA (CAS No. 13862-16-3, TSA. $(SiH_3)_3N$)) is suitable for the deposition of Si-containing films, such as, SiN, $SiO_2$ and SiON, by ALD processes, preferably a PEALD process or a spatial ALD, and has the following advantages:
- a liquid Si-containing precursor at room temperature;
- carbon and halogen-free;
- direct Si—N bonds in the molecule;
- very volatile (vapor pressure: 315 Torr at room temperature);
- boiling point 52° C. at 1 atm;
- thermally stable to enable proper distribution and evaporation using industry standard methods (bubbler, direct liquid injection, vapor draw) without particles generation and product decomposition;
- suitable reactivity with a substrate to permit a wide self-limited ALD window, allowing deposition of a variety of Si-containing films, such as SiN, $SiO_2$ and SiON, etc.;
- suitable reactivity of a chemisorbed precursor with a co-reactant to form a Si-containing film; and
- solid thermal stability of chemisorbed species to prevent self-decomposition and parasitic CVD growth on the surface of the substrate at ultra-low temperature.

To ensure process reliability, the disclosed precursor TSA may be purified by continuous or fractional batch distillation or sublimation prior to use to a purity ranging from approximately 93% by weight or w/w to approximately 100% w/w, preferably ranging from approximately 99% w/w to approximately 99.999% w/w, more preferably, ranging from approximately 99% w/w to approximately 100% w/w.

The disclosed precursor TSA may contain any of the following impurities: undesired congeneric species; solvents; chlorinated metal compounds; or other reaction products. In one embodiment, the total quantity of these impurities is below 0.1% w/w.

Solvents, such as hexane, pentane, dimethyl ether, or anisole, may be used in the synthesis of TSA. The concentration of the solvent in the disclosed TSA may range from approximately 0% w/w to approximately 5% w/w, preferably from approximately 0% w/w to approximately 0.1% w/w.

In one alternative, the disclosed TSA contains less than 5% by volume (v/v), preferably less than 1% v/v, more preferably less than 0.1% v/v, and even more preferably less than 0.01% v/v of any of its undesired congeneric species, reactants, or other reaction products. This alternative may provide better process repeatability. This alternative may be produced by distillation of TSA.

In another alternative, the disclosed TSA may contain between 5% v/v and 50% v/v of one or more of congeneric Si-containing precursors, reactants, or other reaction products, particularly when the mixture provides improved process parameters or isolation of the target compound is too difficult or expensive. For example, a mixture of two Si-containing precursors may produce a stable, liquid mixture suitable for vapor deposition.

The concentration of trace metals and metalloids in the disclosed TSA may each range from approximately 0 ppb to approximately 100 ppb, and more preferably from approximately 0 ppb to approximately 10 ppb.

Also disclosed are methods or processes for forming Si-containing layers on a substrate using an ALD process (e.g., PEALD) in a reaction chamber. The method may be useful in a self-aligned double pattern (SADP) process to conformally deposit a dielectric film over dummy patterns or mandrels in semiconductor manufacture processes or photovoltaic devices. The disclosed TSA may be used to deposit the Si-containing films using ALD methods known to those of skill in the art.

The disclosed processes comprise an ALD process for deposition of Si-containing films using the precursor TSA. Suitable ALD methods include thermal ALD, spatial ALD and temporal ALD methods. Preferably the suitable ALD methods may use a plasma. Exemplary plasma ALDs include a PEALD and a spatial PEALD. It is understood that the suitable ALD may operate in a non-perfect self-limited growth regime, allowing some parasitic CVD to happen. Such parasitic CVD may not be a problem as long as the deposited film meets conformity requirements.

The reaction chamber or the reactor may be any enclosure or chamber of a device in which deposition methods take place, such as, without limitation, a parallel-plate type reactor, a hot-wall type reactor, a single-wafer reactor, a multi-wafer reactor, or other such types of deposition systems. All of these exemplary reaction chambers are capable of serving as an ALD reaction chamber.

The reactor contains one or more substrates onto which the Si-containing film will be deposited. A substrate is generally defined as the material on which a process is conducted. The substrate may be a heat sensitive substrate used in semiconductor, photovoltaic, flat panel, or LCD-TFT device manufacturing. Examples of the heat sensitive substrates include the substrate contains organic materials, such as photo resist, amorphous carbon (a-C), plastics, polyimides, chalcogenide (e.g., GST) or the like. Examples of the heat sensitive substrates include substrates that contain heat sensitive features in the substrate such as extremely fine metal lines in the substrate and/or semiconductor fins in the substrate. Thus, a useable deposition temperature, that is, an ultra-low temperature, for depositing silicon-containing layers on the heat sensitive substrates is necessary to protect the organic martials and/or fine features in the substrate during a deposition process.

The substrate may be a wafer having patterns in it. The wafer may contain apertures, such as trenches or vias, which have an aspect ratio (AR) of 1:1 to 40:1. The deposited silicon-containing film covers at least a part of the aperture. A step coverage of the sidewall of the aperture may be in a range of 0.6 to 1.2. A step coverage of the bottom of the aperture may be in a range of 0.6 to 1.5.

The substrate may also have one or more layers of differing materials already deposited upon it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper, cobalt, ruthenium, tungsten and/or other metal layers (e.g. platinum, palladium, nickel, ruthenium, or gold). The wafers may include barrier layers or electrodes, such as tantalum, tantalum nitride, etc. The layers may be planar or patterned. The substrate may be an organic patterned photoresist film. The substrate may include layers of oxides which are used as dielectric materials in 3D NAND, MIM, DRAM, or FeRam technologies (for example, $ZrO_2$ based materials, $HfO_2$ based materials, $TiO_2$ based materials, rare earth oxide based materials, ternary oxide based materials, etc.) or from nitride-based films (for example, TaN, TiN, NbN) that are used as electrodes. The disclosed processes may deposit the Si-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The actual substrate utilized may also depend upon the specific precursor embodiment utilized.

The disclosed ALD processes using the disclosed TSA may be performed for the substrates having a temperature of approximately 250° C. or lower, preferably approximately 150° C. or lower, more preferably approximately 120° C. or lower, even more preferably approximately 50° C. or lower. The disclosed ALD processes using the precursor TSA may be performed for the substrates having a temperature range from approximately room temperature to approximately 250° C., preferably from approximately room temperature to approximately 150° C., more preferably from approximately room temperature to approximately 110° C.

The temperature of the reactor chamber may be controlled by either controlling the temperature of the substrate holder or controlling the temperature of the reactor wall. Devices used to heat the substrate are known in the art. The reactor wall is heated to a sufficient temperature to prevent condensation on the wall or the reactor chamber, especially when a shower head reactor is used, in which the substrate temperature is higher than the temperature of the wall. A non-limiting exemplary temperature range to which the reactor wall may be heated includes a range from approximately 20° C. to approximately 250° C., preferably from approximately 20° C. to approximately 150° C., more preferably from 20° C. to approximately 110° C. Alternatively, a non-limiting exemplary temperature to which the reactor wall may be heated includes approximately 300° C. or lower. When a plasma deposition process is performed, the substrate is heated to a sufficient temperature to obtain a desired thickness of the film at a sufficient growth rate and with desired physical state and composition. For the plasma deposition process, the deposition temperature may range from approximately 20° C. to approximately 250° C., preferably from approximately 20° C. to approximately 150° C., more preferably from 20° C. to approximately 110° C.

The pressure within the reaction chamber are held at conditions suitable for the precursor TSA to react with the surface of the substrate. For instance, the pressure in the reactor may be held between approximately 0.1 Torr and approximately 100 Torr, preferably between approximately 1 Torr and approximately 50 Torr, more preferably between approximately 1 Torr and approximately 10 Torr.

In addition to the disclosed precursor TSA, a reactant or a co-reactant may also be introduced into the reactor. The co-reactant may be a nitrogen-containing gas or a reducing gas. The nitrogen-containing gas includes, but is not limited to, $NH_3$, NO, $N_2O$, hydrazines, primary amines such as methylamine, ethylamine, tertbutylamine; secondary amines such as dimethylamine, diethylamine, di-isopropylamine, ethylmethylamine, pyrrolidine; tertiary amines such as trimethylamine, triethylamine, trisilylamine, $N_2$, $N_2/H_2$ mixture thereof, preferably $NH_3$. The co-reactant may be activated by a plasma, either in-situ or remotely. For $N_2$ or $N_2/H_2$, the plasma activation is required. The co-reactant may be selected from $NH_3$, NO, $N_2O$, hydrazines, $N_2$ plasma, $N_2/H_2$ plasma, amines and combinations thereof. Applicants discovered that $N_2$ plasma may be an adequate co-reactant when the substrate temperature is lower than 250° C. Alternatively, the co-reactant may be an oxygen-containing gas or an oxidizer. The oxygen-containing gas includes, but is not limited to, oxidizers such as, $O_3$, $O_2$, $H_2O$, NO, $N_2O$, $H_2O_2$, O radicals and combinations thereof, preferably $O_3$ or $O_2$.

Furthermore, the co-reactant is a plasma source containing at least one of hydrogen, nitrogen, and oxygen. The plasma source may be a nitrogen plasma, nitrogen/helium plasma, nitrogen/argon plasma, ammonia plasma, ammonia/helium plasma, ammonia/argon plasma, helium plasma, argon plasma, hydrogen plasma, hydrogen/helium plasma, hydrogen/organic amine plasma, and mixtures thereof.

The substrate exposure time in the disclosed ALD processes using the disclosed TSA precursor may range from 1 millisecond to 5 minute, preferably from 1 second to 20 second. The co-reactant exposure time in the disclosed ALD processes may range from 1 millisecond to 3 minute, preferably from 100 millisecond to 60 second.

The disclosed ALD process or sequence typically includes a step to remove excess precursor TSA from the deposition surface by providing a purge step, either by purging a reactor with an inert gas, such $N_2$, Ar, Kr or Xe, or passing the substrate in a sector under high vacuum and/or a carrier gas curtain. The disclosed ALD process or sequence typically also includes a step to remove excess co-reactant from the deposition surface by providing a purge step, either by purging a reactor with an inert gas, such $N_2$, Ar, Kr or Xe, or passing the substrate in a sector under high vacuum and/or a carrier gas curtain.

The disclosed precursor TSA and the co-reactant may be introduced into the reactor sequentially (ALD). The reactor may be purged with an inert gas, such $N_2$, Ar, Kr or Xe, following the introduction of the precursor and the introduction of the co-reactant, respectively.

Alternatively, the substrate may be moved from one area for precursor TSA exposure to another area for co-reactant exposure, which is a spatial ALD or spatial PEALD process.

Depending on the particular process parameters, deposition may take place for a varying length of time. Generally, deposition may be allowed to continue as long as it is desired or necessary to produce a film with the necessary thickness. Typical film thicknesses may vary from an atomic monolayer to several hundreds of microns, depending on specific deposition processes, preferably between approximately 1 nm and approximately 100 nm, more preferably between approximately 1 nm and approximately 50 nm. The deposition process may also be performed as many times as necessary to obtain a desired thickness of the film.

In one non-limiting exemplary ALD type process, the vapor phase of the disclosed precursor TSA is introduced into the reactor, where TSA physi- or chemisorbs on the substrate. Excess composition may then be removed from the reactor by purging and/or evacuating the reactor. A desired reducing gas (for example, $N_2$) is introduced into the reactor where it reacts with the physi- or chemisorbed precursor in a self-limiting manner. Any excess reducing gas is removed from the reactor by purging and/or evacuating the reactor. If the desired film is a SiN film, this two-step process may provide the desired film thickness or may be repeated until a film having the desired thickness has been obtained. Replacing the reducing gas to an oxidizer, such as, $O_3$ or $O_2$, a desired film thickness of $SiO_2$ film will be produced with this two-step process as well.

The disclosed PEALD processes using the disclosed precursor TSA with $N_2$ plasma as a co-reactant is able to deposit high-quality SiN film having the properties of WER less than approximately 0.50 (normalized to thermally grown $SiO_2$), GPC ranging from approximately 0.015 nm/cycle to approximately 0.15 nm/cycle, RI ranging from approximately 1.9 to approximately 2.18, carbon-free or the C concentration in the formed film being in a range of 0% to approximately % density approximately 2.98 g/cm³, from the example that follows.

EXAMPLES

The following non-limiting examples are provided to further illustrate embodiments of the invention. However, the examples are not intended to be all inclusive and are not intended to limit the scope of the inventions described herein.

Example 1. PEALD of SiN Film Using TSA with N₂ Plasma at 250° C.

The results of PEALD of SiN film using TSA at 250° C. are as follows.
Growth per cycle (GPC): 0.95 nm/cycle;
Refractive index (RI): 1.97;
Density: 2.97 g/cm³;
Wet etching rate (WER) in 0.1% hydrogen fluoride (HF): 0.21 (normalized with thermal-oxide SiO₂);
No Si—H was observed in FT-IR; and
No C or halogen was observed in XPS.

Example 2. PEALD of SiN Film Using TSA with N₂ Plasma at 110° C.

The results of PEALD of SiN film using TSA at 110° C. are as follow.
Growth per cycle (GPC): 0.107 nm/cycle;
Refractive index (RI): 1.95;
Density: 2.98 g/cm³;
Wet etching rate (WER) in 0.1% HF: 0.3 (normalized with thermal-oxide SiO₂);
No Si—H was observed in FT-IR; and
No C or halogen was observed in XPS.
The film quality of the SiN film formed by PEALD with TSA at 110° C. was almost the same as the SiN film deposited at 250° C. by PEALD with TSA, referring to FIG. 1. To our knowledge, such high-quality SiN film has never been achieved with other aminosilane precursors. For example, an aminosilane, disilyl silane diamine (DDSDA) shown in FIG. 1, in which GPC: 0.7, density: 2.75 g/cm³, WER: 1.5, at 110° C. deposition temperature. Furthermore, Knoops et al. (Harm. C. M. Knoops et al., App. Mater, Interfaces, 2015, 7, page 19857-19862) discloses that PEALD of SiN film with bis(tert-butylamino)silane (BT-BAS) and N₂ plasma at 100° C. has a lower film quality than the SiN film formed by PEALD with TSA at 110° C. The results of PEALD of the SiN film with BTBAS and N₂ plasma at 100° C. include RI: 1.63; GPC: 0.093 nm/cycle; density: no data at 100° C. but 2.2 g/cm³ at 200° C. Table 1 is a comparison of the SiN films formed by PEALD using TSA, DDSDA and BTBAS. The data for BTBAS are reproduced from Knooks et al. The structure of DDSDA is

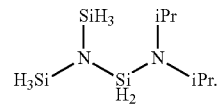

TABLE 1

| Si precursor | TEMP (° C.) | RI | Density (g/cm³) | C conc. (%) | Si—H | GPC (nm/cycle) | WER |
|---|---|---|---|---|---|---|---|
| TSA | 110 | 1.95 | 2.98 | 0 | Not detected | 0.107 | 0.30 |
| TSA | 250 | 1.97 | 2.97 | 0 | Not detected | 0.095 | 0.21 |
| DDSDA | 105 | 1.91 | 2.75 | 5 | Detected | 0.7 | 1.5 |
| BTBAS | 100 | 1.63 | <2.20 | 25 | N/A | 0.093 | N/A |
| BTBAS | 200 | 1.90 | 2.80 | 2 | N/A | 0.021 | N/A |

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings. While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:
1. A method for depositing a silicon-containing film on a substrate, the method comprising the steps of:
   a) introducing a vapor of trisilylamine into a reactor having a substrate disposed therein;
   b) introducing a co-reactant gas N₂ plasma into the reactor; and
   c) repeating the steps of a) and b) until a desired thickness of the silicon-containing film is deposited on the substrate using a vapor deposition method at a deposition temperature ranging from approximately 20° C. to approximately 250° C.,
   wherein the deposited silicon-containing film is carbon free and Si—H free,
   wherein a density of the deposited silicon-containing film is around 2.98 g/cm³.

2. The method of claim 1, further comprising the steps of:
purging the vapor of trisilylamine from the reactor with a first purging gas following the step of a); and
purging the co-reactant gas from the reactor with a second purging gas following the step of b).

3. The method of claim 2, wherein the first purging gas and the second purging gas are an inert gas selected from $N_2$, Ar, Kr or Xe.

4. The method of claim 1, wherein the deposition temperature ranges from approximately 20° C. to approximately 150° C.

5. The method of claim 1, wherein the deposition temperature ranges from approximately 20° C. to approximately 110° C.

6. The method of claim 1, wherein the substrate has a trench or hole having an aspect ratio of around 1:1 to around 40:1.

7. The method of claim 6, wherein the silicon-containing film covers at least a part of the trench or hole.

8. The method of claim 6, wherein a step coverage of the side wall of the aperture is in a range of around 0.6 to around 1.2, and a step coverage of the bottom of the aperture is in a range of around 0.6 to around 1.5.

9. The method of claim 1, wherein the vapor deposition process is an ALD process.

10. The method of claim 9, wherein the ALD process is a PEALD process or a spatial ALD process.

11. The method of claim 1, wherein the substrate is a heat sensitive substrate containing organic materials selected from photo resist, a-C, plastics, polyimides, or chalcogenide, and heat sensitive features including extremely fine metal lines in the substrate.

12. The method of claim 1, wherein the Si-containing film is SiN or SiON.

13. The method of claim 1, wherein the silicon-containing film is carbon free.

14. The method of claim 1, wherein a GPC of the Si containing film is in the range of approximately 0.015 nm/cycle to approximately 0.15 nm/cycle.

15. The method of claim 1, wherein a RI of the silicon-containing film is around 1.96.

* * * * *